United States Patent
Lim et al.

(10) Patent No.: US 7,098,590 B2
(45) Date of Patent: Aug. 29, 2006

(54) ORGANIC ELECTROLUMINESCENT DEVICE USING OPTICAL RESONANCE EFFECT

(75) Inventors: Jung Ku Lim, Ulsan (KR); Wi Jin Nam, Busan (KR)

(73) Assignee: Samsung SDI Co., Ltd., Suwon-si (KR)

( * ) Notice: Subject to any disclaimer, the term of this patent is extended or adjusted under 35 U.S.C. 154(b) by 163 days.

(21) Appl. No.: 10/663,762

(22) Filed: Sep. 17, 2003

(65) Prior Publication Data

US 2004/0056590 A1     Mar. 25, 2004

(30) Foreign Application Priority Data

Sep. 18, 2002    (KR) ............... 10-2002-0056813

(51) Int. Cl.
*H05B 33/22* (2006.01)
(52) U.S. Cl. .................. 313/504; 313/506
(58) Field of Classification Search ........ 313/503–506, 313/507, 508, 509; 428/690; 315/169.3; 345/36
See application file for complete search history.

(56) References Cited

U.S. PATENT DOCUMENTS

| | | | |
|---|---|---|---|
| 5,652,067 A * | 7/1997 | Ito et al. .................. | 428/690 |
| 5,701,055 A * | 12/1997 | Nagayama et al. ......... | 313/504 |
| 5,780,174 A * | 7/1998 | Tokito et al. .............. | 428/690 |
| 5,814,416 A * | 9/1998 | Dodabalapur et al. ...... | 428/690 |
| 5,932,327 A * | 8/1999 | Inoguchi et al. ........... | 428/212 |
| 5,949,187 A * | 9/1999 | Xu et al. ................... | 313/504 |
| 5,952,037 A * | 9/1999 | Nagayama et al. .......... | 427/66 |
| 5,998,805 A * | 12/1999 | Shi et al. .................. | 257/40 |
| 6,133,692 A | 10/2000 | Xu et al. | |
| 6,228,457 B1 * | 5/2001 | Ueno et al. ............... | 428/64.1 |
| 6,469,439 B1 * | 10/2002 | Himeshima et al. ........ | 313/506 |
| 2003/0117070 A1 * | 6/2003 | Komatsu et al. ............ | 313/506 |
| 2004/0031965 A1 * | 2/2004 | Forrest et al. .............. | 257/79 |

FOREIGN PATENT DOCUMENTS

| | | |
|---|---|---|
| EP | 1244153 | 9/2002 |
| GB | 2349979 | 11/2000 |

(Continued)

OTHER PUBLICATIONS

A. Dodabalapur et al., "Color variation with electroluminescent organic semiconductors in multimode resonant cavities", *Applied Physics Letters*, vol. 65, No. 18, Oct. 31, 1994, pp. 2308-2310.

(Continued)

*Primary Examiner*—Ashok Patel
*Assistant Examiner*—Chris Raabe
(74) *Attorney, Agent, or Firm*—Stein, McEwen & Bui, LLP (57) ABSTRACT

An organic electroluminescent device induces optical resonance with a simple structure, the organic electroluminescent device including: a transparent substrate; a semi-transparent layer formed on the transparent substrate; a first anode layer formed on the semi-transparent layer as a predetermined pattern; a cathode layer formed of a metallic total reflection layer on the first anode layer; and an organic layer formed between the first anode layer and the cathode layer, which includes at least an emitting layer, wherein an optical distance between a top surface of the semi-transparent layer and a bottom surface of the cathode layer is determined to be a least integer multiple of half the peak wavelengths of light of a predetermined set of colors. Due to a resonance effect of the organic electroluminescent device, the emission efficiency of wavelengths of light of different colors is improved, and high-purity quality pictures may be displayed on the organic electroluminescent device.

24 Claims, 4 Drawing Sheets

FOREIGN PATENT DOCUMENTS

| | | |
|---|---|---|
| WO | 01/04963 | 1/2001 |
| WO | 02/21883 | 3/2002 |

OTHER PUBLICATIONS

T. Nakayama et al., "Investigations on Multicolor Display by Organic Luminescent Devices with Optical Microcavity Structure", *Electronics and Communications in Japan (Part II: Electronics)*, vol. 78, No. 2, Feb. 1995, pp. 98-104.

K. Neyts et al., "Semitransparent metal or distributed Bragg reflector for wide-viewing-angle organic light-emitting-diode microcavities", *Journal of the Optical Society of America B: Optical Physics*, vol. 17, No. 1, Jan. 2000, pp. 114-119.

European Search Report issued on Aug. 2, 2005, in European patent application No. 03255847.

* cited by examiner

ORGANIC ELECTROLUMINESCENT DEVICE USING OPTICAL RESONANCE EFFECT

CROSS-REFERENCE TO RELATED APPLICATIONS

This application claims priority from Korean Patent Application No. 2002-56813, filed on Sep. 18, 2002, in the Korean Intellectual Property Office, the disclosure of which is incorporated herein in its entirety by reference.

BACKGROUND OF THE INVENTION

1. Field of the Invention

The present invention relates to an organic electroluminescent device, and more particularly, to an organic electroluminescent device using an optical resonance effect.

2. Description of the Related Art

Electroluminescent (EL) display devices may be classified into inorganic and organic devices depending on the material composing their emitter layers.

In organic EL devices, externally injected electrons and holes combine in an emitter layer and dissipate to generate excitons. As these excitons transit from an excited state to a base state, energy is transferred to fluorescent molecules in the emitter layer, enabling the molecules to emit light and display images. For every three triplet excitons, only a singlet exciton is generated, the energy level of which is different from that of the triplet excitons. Energy from singlet excitons is used for luminescence, whereas energy from triplet excitons is converted into thermal energy.

Organic EL devices provide a greater brightness, a greater driving voltage, a faster response rate, a wider viewing angle, and a sharper contrast, as compared with inorganic EL devices, and advantageously may display a range of colors. Thus, organic EL devices have received considerable attention and are regarded as the next-generation of display devices.

A general organic EL device includes an anode layer formed as a predetermined pattern on a substrate, a hole transporting layer, an emissive layer, and an electron transporting layer, which are sequentially stacked upon one another, and a cathode layer formed as a predetermined pattern intersecting the pattern of the anode layer at a right angle. All of the hole transporting layer, the emissive layer, and the electron transporting layer are organic thin films formed of organic substances.

Conventional organic EL devices are disadvantageous, for example, in terms of luminance, power consumption, and lifetime, due to their low luminance efficiency. Especially for organic EL devices which contain low molecular weight fluorescent dyes, emission efficiency is very low due to a low maximum emission efficiency of 25% from singlet excitons, reduced external light emission caused by internal total reflection, destructive interference with light reflected from the cathode layer, and light absorption by a polarizing plane. Therefore, high-luminance, low-power display devices may not be realized with such conventional organic EL devices. Furthermore, conventional organic EL devices have wide photoluminescent spectra, so that color purity is reduced.

To resolve the problems of conventional organic EL devices, use of a half mirror formed by alternatively depositing high refractive index layers and low refractive index layers, which is based on the concept of an optical microcavity, to adjust reflectivity.

Figure 1A:
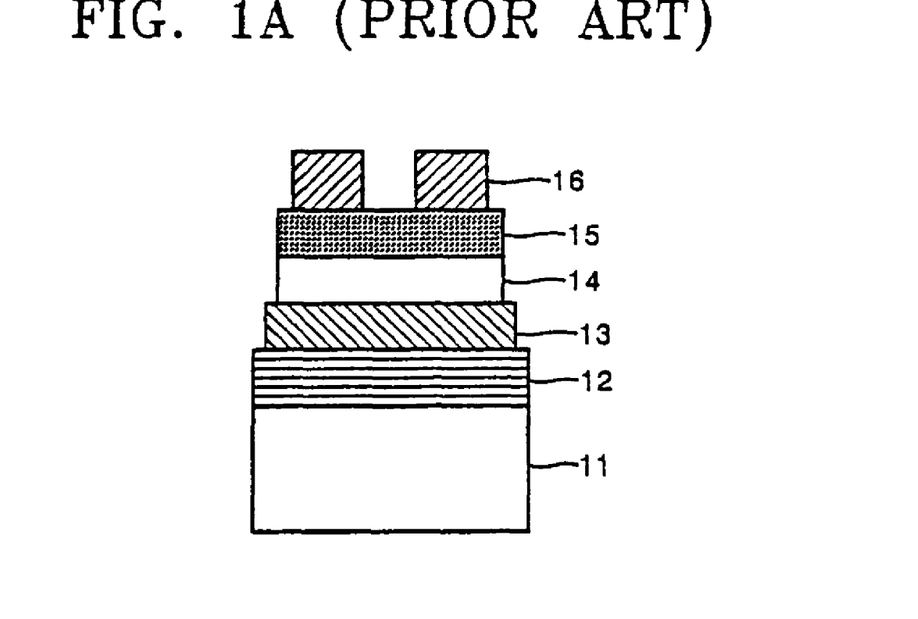
FIGS. 1A and 1B are sectional views of a conventional organic electroluminescent (EL) device.
Figure 1B:
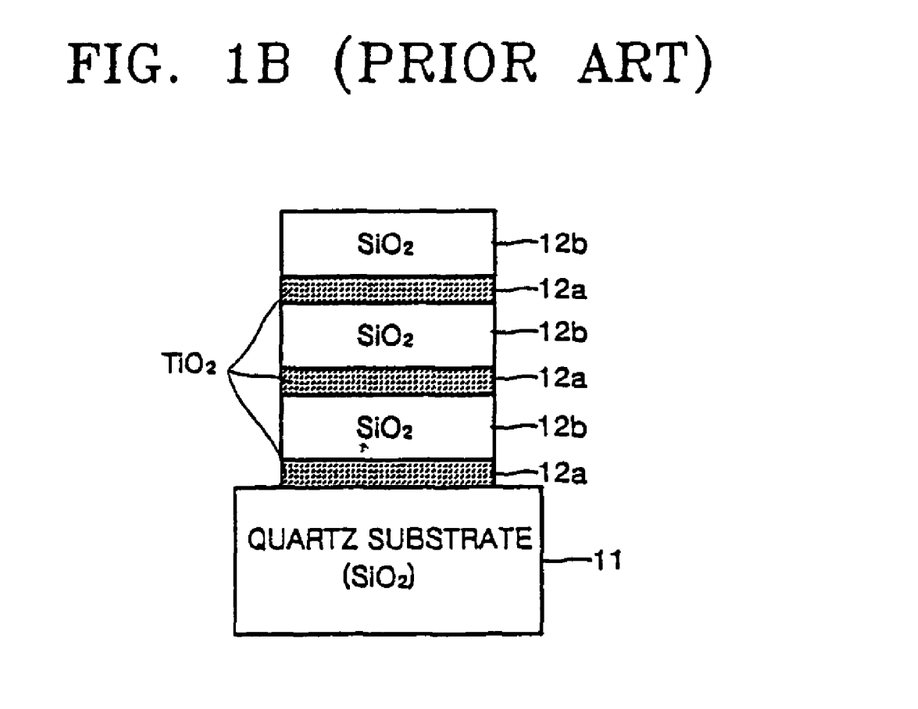

FIG. 1A is a sectional view of a conventional organic EL device, and FIG. 1B is an enlarged sectional view of a half mirror.

Referring to FIG. 1A, a conventional organic EL device may include a half mirror 12 deposited on a silicon oxide substrate 11 as a stack of multiple layers, an indium tin oxide (ITO) anode layer 13, a triphenyl diamine derivative (TAD) layer 14, an ALQ (Trix-(8-hydroxyquinoline) aluminum) layer 15, and a metal anode layer 16 having a predetermined pattern, which are sequentially stacked upon one another. Here, ITO has a refractive index of 1.7–2.1, and ALQ and TAD have a refractive index of 1.7.

Referring to FIG. 1B, the half mirror 12 includes a total of six layers, including alternating large refractive index $TiO_2$ layers 12a having a refractive index of 2.3, and low refractive index $SiO_2$ layers 12b having a refractive index of 1.4.

In such a half mirror having the stacked structure, there is a need to stack more layers for improved reflection characteristics. However, the organic EL device suggested by the prior art requires accurate control regarding the number and the thickness of layers to be stacked to control the reflectance of light having a particular wavelength, which complicates the manufacturing process.

SUMMARY OF THE INVENTION

The present invention provides an organic electroluminescent (EL) device that induces optical resonance with a simple stacked structure to amplify various wavelengths of light for enhanced luminescence and improved color purity.

In accordance with an aspect of the present invention, an organic electroluminescent device comprises: a transparent substrate; a semi-transparent layer formed on the transparent substrate; a first anode layer formed on the semi-transparent layer as a predetermined pattern; a cathode layer formed of a metallic total reflection layer on the first anode layer; and an organic layer formed between the first anode layer and the cathode layer, which includes at least an emitting layer, wherein an optical distance between a top surface of the semi-transparent layer and a bottom of the cathode layer is determined to be a least integer multiple of half the peak wavelengths of light of a predetermined set of colors.

According to a specific embodiment of the present invention, the optical distance between the top surface of the semi-transparent layer and the bottom of the cathode layer is the sum of the products of the refractive indices and the thicknesses of the respective first anode layer and organic layer.

In an organic EL device according to the present invention, the first anode layer and the organic layer are formed as a stripe pattern, and the cathode layer is formed as a stripe pattern perpendicular to the stripe pattern of the first anode layer and the organic layer. Alternatively, the first anode layer may be formed as a stripe pattern, and the organic layer and the cathode layer may be formed as a stripe pattern perpendicular to the stripe pattern of the first anode layer.

In an organic EL device according to the present invention, the semi-transparent layer, the first anode layer, and the organic layer are formed as a stripe pattern, and the cathode layer is formed as a stripe pattern perpendicular to the stripe pattern of the semi-transparent layer, the first anode layer, and the organic layer. Alternatively, the semi-transparent layer and the first anode layer may be formed as a stripe pattern, and the organic layer and the cathode layer may be formed as a stripe pattern perpendicular to the stripe pattern of the semi-transparent layer and the first anode layer.

An organic EL device according to the present invention may further comprise a transparent spacer layer between the semi-transparent layer and the first anode layer, wherein the thickness of the transparent spacer layer is appropriately controlled to a level at which optical resonance may be induced. In this case, the optical distance between the top surface of the semi-transparent layer and the bottom of the cathode layer is the sum of the products of the refractive indices and the thicknesses of the respective transparent spacer layer, first anode layer, and organic layer. The semi-transparent layer, the transparent spacer layer, the first anode layer, and the organic layer are formed as a stripe pattern, and the cathode layer is formed as a stripe pattern perpendicular to the stripe pattern of the semi-transparent layer, the transparent spacer layer, the first anode layer, and the organic layer. Alternatively, the semi-transparent layer, the transparent spacer layer, and the first anode layer may be formed as a stripe pattern, and the organic layer and the cathode layer may be formed as a stripe pattern perpendicular to the stripe pattern of the semi-transparent layer, the transparent spacer layer, and the first anode layer.

An organic EL device according to the present invention may further comprise a second anode layer between the transparent substrate and the semi-transparent layer. In this case, the optical distance between the top surface of the semi-transparent layer and the bottom of the cathode layer is the sum of the products of the refractive indices and the thicknesses of the respective first anode layer and organic layer. The second anode layer, the semi-transparent layer, the first anode layer, and the organic layer are formed as a stripe pattern, and the cathode layer is formed as a stripe pattern perpendicular to the stripe pattern of the second anode layer, the semi-transparent layer, the first anode layer, and the organic layer. Alternatively, the second anode layer, the semi-transparent layer, and the first anode layer are formed as a stripe pattern, and the organic layer and the cathode layer are formed as a stripe pattern perpendicular to the stripe pattern of the second anode layer, the semi-transparent layer, and the first anode layer.

An organic EL device according to the present invention may further comprise a metal oxide layer deposited on the top surface of the transparent substrate. In this case, the metal oxide layer is one selected from the group consisting of a $SiO_2$ layer, a $TiO_2$ layer, a $Y_2O_3$ layer, and a $Nb_2O_5$ layer.

According to specific embodiments of the organic EL devices according to the present invention described above, the transparent substrate is a glass substrate. The semi-transparent layer is a thin metal layer. The thin metal layer for the semi-transparent layer may be formed of silver or aluminum having a small light absorption coefficient. The thin metal layer for the semi-transparent layer may be formed of a silver-copper-gold alloy or a silver-palladium-copper alloy for durability.

As described above, in an organic EL device according to the present invention, a semi-transparent layer is disposed between the anode and the cathode, and the distance between the semi-transparent layer and the cathode is adjusted to induce constructive interference of red, green, and blue light for enhanced luminescence and improved color purity.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the embodiments of the present invention, examples of which are illustrated in the accompanying drawings, wherein like reference numerals refer to the like elements throughout. The exemplary embodiments are described below to explain the present invention by referring to the figures. In the drawings, the thickness and the width of layers and regions are exaggerated for clarity.

Figure 2A:
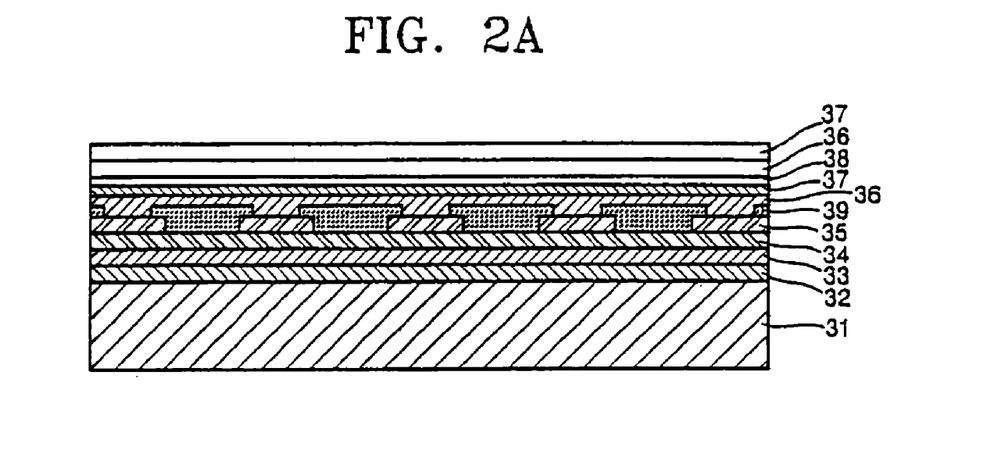
FIGS. 2A and 2B are sectional and perspective views, respectively, of an organic EL device according to a first embodiment of the present invention.
Figure 2B:
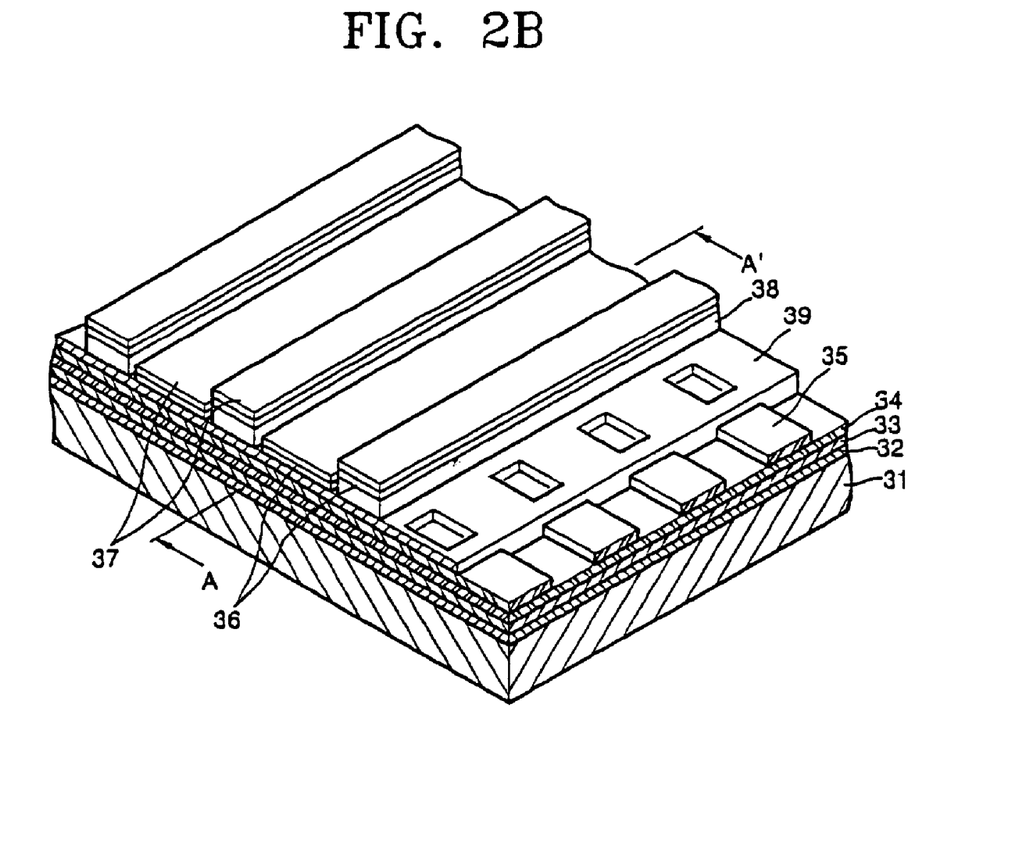

A perspective view of an organic EL device according to a first embodiment of the present invention, which is a passive matrix, forward-emission display type, is shown in FIG. 2B. FIG. 2A is a sectional view of the organic EL device of FIG. 2B, taken along line A–A'.

Referring to FIGS. 2A and 2B, an organic EL device according to the first embodiment of the present invention includes a transparent glass substrate 31; a metal oxide layer 32, a thin metal layer 33, and a transparent spacer layer 34, which are sequentially deposited on the glass substrate 31; an indium tin oxide (ITO) anode layer 35 formed on the transparent spacer layer 34 as stripes; an inter-insulating layer 39 deposited on the transparent spacer layer 34 and the ITO anode layer 35 and patterned to expose a light emitting region of the ITO anode layer 35, as shown in FIG. 2B; an organic layer 36 on the inter-insulating layer 39; and a cathode layer 37 deposited on the organic layer 36 as a metallic total reflection layer. The organic layer 36 includes a hole injecting layer (HIL) contacting the exposed light emitting region of the ITO anode layer 35, a hole transporting layer (HTL), an emitting layer (EML), an electron transporting layer (ETL), and an electron injecting layer (EIL).

In FIGS. 2A and 2B, reference numeral 38 denotes a separator for insulating the cathode layer 37 to discriminate a light-emitting region and a non-light emitting region. In an organic EL device according to another embodiment of the present invention where such a separator is not formed, the cathode layer 37 may be formed as a pattern remaining only in the light-emitting region and perpendicular to the ITO anode layer 35, so that the light-emitting region and the non-light emitting region may be separated from one another.

The glass substrate may be formed of any transparent material. The metal oxide layer 32 is formed of a material layer having effective adhesion to the thin metal layer 33 and the glass substrate 31. Examples of such a material layer for the metal oxide layer 32 include a SiO$_2$ layer, a TiO$_2$ layer, a Y$_2$O$_3$ layer, a Nb$_2$O$_5$ layer, and the like.

The thin metal layer 33, which is a semi-transparent layer to reflect a portion of light and transmit a portion of light, induces optical resonance together with the cathode layer 37. Any metal layer may reflect and transmit light as long as it is deposited as a thin layer. However, for higher emission efficiency, it is preferable that the thin metal layer 33 is formed of silver (Ag) or aluminum (Al), which absorb less light. A metal alloy, such as Ag—Cu—Au (ACA) or Ag—Pd—Cu (APC), may be used for a durable thin metal layer. In addition to the thin metal layer 33, another semi-transparent layer to transmit and reflect light may be formed of a material different from the thin metal layer 33.

Light generated in the emitting layer is totally reflected at the cathode layer 37, formed of a total reflection metal layer, and goes toward the thin metal layer 33. A portion of the light is transmitted through the thin metal layer 33, and a portion of the light is reflected back at the thin metal layer 33, and goes toward the cathode layer 37. In the organic EL device, according to the first embodiment of the present invention, the distance between the cathode layer 37 and the thin metal layer 33 is adjusted to induce optical resonance when light transmission and reflection occur repeatedly between two reflector layers, i.e., the cathode layer 37 and the thin metal layer 33, causing interference. A structure including two reflection surfaces, appropriately spaced apart to induce optical resonance, is referred to as a "microcavity structure".

The organic EL device, according to an embodiment of the present invention, requires the following conditions to induce optical resonance.

A first requisite is the reflectivity of the semi-transparent thin metal layer 33. The reflectivity of the thin metal layer 33 varies depending on the kind of metal or alloy used and the film deposition conditions, but mainly it depends on the thickness of the thin metal layer 33. The depth of transmission of light to the thin metal layer 33 varies depending on the metal composing the thin metal layer 33, so it is desirable to determine the optimal thickness of the thin metal layer 33 experimentally, as opposed to using theoretical data.

A second requisite is the optical distance between the cathode layer 37 and the thin metal layer 33. The optical distance from the top of the thin metal layer 33 to the bottom of the cathode layer 37 is equal to the sum of the optical thicknesses of the layers between the thin metal layer 33 and the cathode layer 37, wherein the optical thickness of each of the layers is the product of the refractive index and the geometric thickness of the layer. In other words, the optical thicknesses of layers vary depending on their refractive indices, even when having the same geometric thickness. In addition, since the refractive index is a function of wavelength, the optical thickness of a layer varies depending on the wavelength of light.

As an example, the refractive indices of the layers composing an organic EL device according to the first embodiment of the present invention, for blue light having a peak wavelength of 460 nm, is shown in Table 1 below.

TABLE 1

| Layer | Material | Refractive Index | Thickness (Å) |
|---|---|---|---|
| Cathode Layer | Al | First reflection surface | 600 |
| EIL | | 1.7111 | 0 |
| ETL | | 1.7126 | 260 |

TABLE 1-continued

| Layer | Material | Refractive Index | Thickness (Å) |
|---|---|---|---|
| EML(Blue) | | 1.7625 | 300 |
| EML(Green) | | 1.7126 | 430 |
| EML(Red) | | 1.669 | 300 |
| HTL | | 1.8707 | 150 |
| HIL | | 1.8934 | 700 |
| Anode layer | ITO | 1.9473 | 1600 |
| Transparent spacer layer | Nb$_2$O$_5$ | 2.1915 | 3500 |
| Buffer layer | Al$_2$O$_3$ | 1.779 | 100 |
| Thin metal layer | Al | Second reflection surface | 122 |
| Metal oxide layer | Nb$_2$O$_5$ | | 200 |
| Substrate | Soda Lime | | 0.7 mm |

In Table 1 above, the refractive indices are experimental data. The optical distance between the first reflection surface and the second reflection surface is equal to the sum of the product of the refractive index and the geometric thickness of each of the layers between the cathode layer 37 and the thin metal layer 33. In addition, the sum of the optical thicknesses of the layers should be an integer multiple of half the peak wavelengths to induce constructive interference in the microcavity structure. This requirement may be expressed as equation (1) below:

$$\Sigma(n \times d)\text{Layers} = m \times \lambda/2 \qquad (1)$$

where n is a refractive index, d is the geometric thickness of a layer, m is an integer, and λ is a peak wavelength, which was 460 nm in the above experiment.

For coincident constructive interference of red, green, and blue light, the sum of the optical thicknesses of the layers on the left side of equation (1) above should be equal to an integer multiple of half of each the peak wavelengths of red, green, and blue light. This may be achieved by adjusting the thickness of the transparent spacer layer 34 to an appropriate thickness. Among the possible sums of the optical thicknesses of the layers, the least common multiple of the sums of the optical thicknesses of the layers is selected. As shown in Table 1 above, when the transparent spacer layer 34 is formed of Nb$_2$O$_5$ to have a thickness of 3500 Å, the requirement for the sum of the optical thicknesses of the layers, i.e., to be the least common multiple, is satisfied, and optical resonance may be induced.

This resonance effect induced by adjusting the optical distance between the cathode layer 37 and the thin metal layer 33 may be verified using the maximum transmittance calculated from equation (2) below:

$$T_{max} = \frac{T_1 \times T_2 \times \exp(-2\beta)}{\left[1 - \sqrt{(R_1 \times R_2) \times \exp(-2\beta)}\right]^2} \quad \text{where } \beta = 2\pi k d \cos\frac{\theta}{\lambda} \qquad (2)$$

where T$_1$ and R$_1$ denote the transmittance and the reflectance of the uppermost cathode layer 37, respectively, T$_2$ and R$_2$ denote the transmittance and the reflectance of the semi-transparent thin metal layer 33, k is a decay constant, d is the geometric thickness of the multiple layers between the cathode layer 37 and the thin metal layer 33, θ is a light emission angle from the multiple layers between the cathode layer 37 and the thin metal layer 33, and λ is the wavelength of light.

The ratio of amplifying the front transmission for each color of light in the organic EL device according to the first embodiment of the present invention, compared to a conventional EL device having no metal reflection layer, was calculated while varying the reflectance of the thin metal (reflectance) layer 33, with the assumption that the total reflectance at the boundary between a SiO$_2$ layer and an ITO substrate of the conventional EL device is 1.8%. The results are shown in Table 2 below.

TABLE 2

| Reflectance | 40% | 50% | 60% |
|---|---|---|---|
| Red light | 2.4 | 2.7 | 3.1 |
| Green light | 2.3 | 2.6 | 2.9 |
| Blue light | 1.9 | 2.0 | 2.1 |

As is apparent from Table 2, when the semi-transparent thin metal layer 33 has a reflectance of 60%, the emission of red, green, and blue light increases by 3.1 times, 2.9 times, and 2.1 times, respectively, when the thickness of the transparent spacer layer 34 in the microcavity of the EL device is appropriately adjusted, as in the present invention.

After the verification of the maximum transmittance using equation (2) above, the semi-transparent thin metal layer 33 is designed to have an appropriate reflectance. As a result, an organic EL device with enhanced luminance, e.g., at least double the unadjusted luminance, may be manufactured. In an organic ED device according to the present invention, the driving voltage is relatively low at a given luminance, so that less power is consumed with extended lifetime. The organic EL device according to the first embodiment of the present invention utilizes optical resonance, so that the half bandwidth for each color of light in the photoluminescent spectra becomes narrow, and color purity is improved. An organic EL device having a desired peak emission may be implemented by adjusting the thickness of the layers comprising the organic EL device according to an embodiment of the present invention.

Despite the advantages of the organic EL device according to the first embodiment of the present invention, the stacked structure of the thin metal layer 33, the transparent spacer layer 34, and the anode layer 35 has a capacitance, like a capacitor, and causes coupling between cathode stripes, thus degrading picture quality. To compensate for this drawback, the transparent spacer layer 34 and the thin metal layer 33 may be formed as stripes aligned with the stripes of the anode layer 35, as shown in FIGS. 3A and 3B.

Figure 3A:
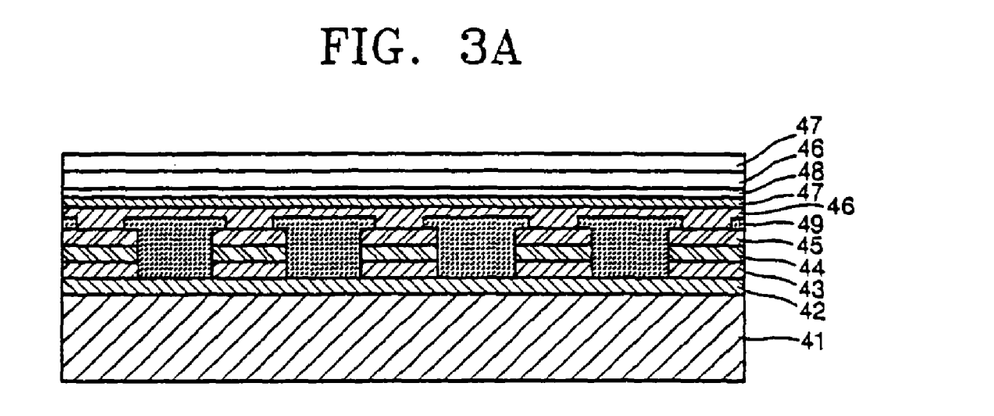
FIGS. 3A and 3B are sectional and perspective views, respectively, of an organic EL device according to a second embodiment of the present invention.
Figure 3B:
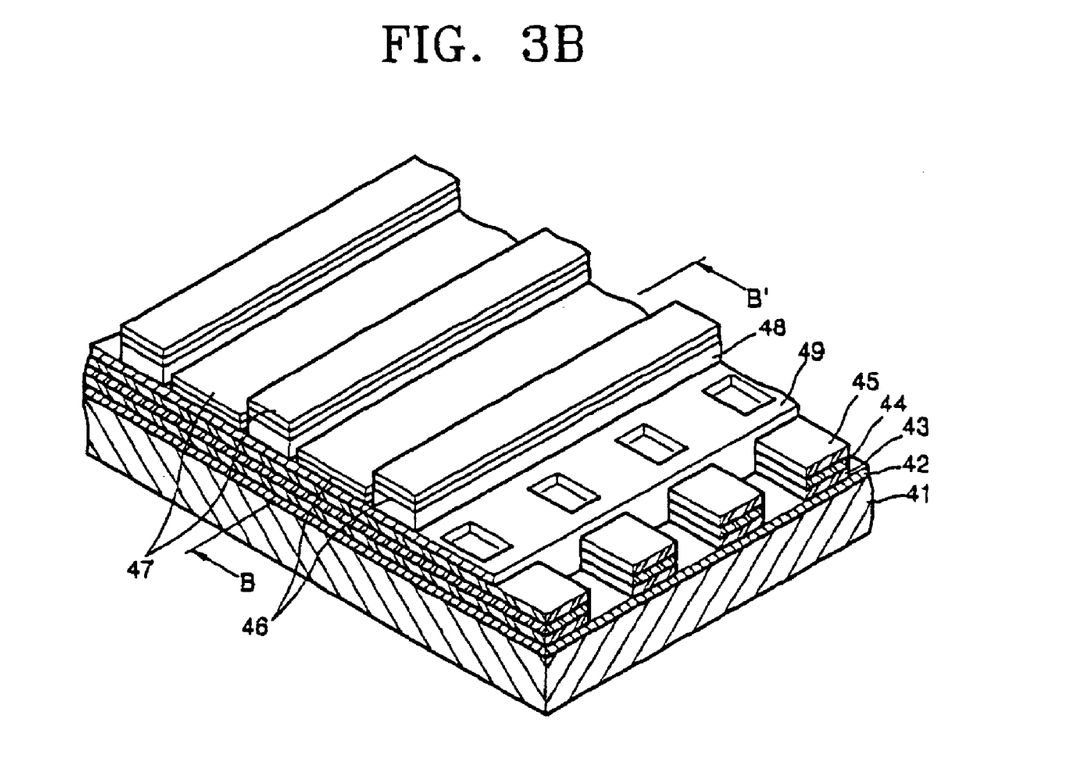

FIG. 3B is a perspective view of an organic EL device according to a second embodiment of the present invention, and FIG. 3A is a sectional view of the organic EL device of FIG. 3B, taken along line B–B'.

Referring to FIGS. 3A and 3B, an organic EL device according to the second embodiment of the present invention includes: a transparent glass substrate 41; a metal oxide layer 42 deposited on the glass substrate 41; a thin metal layer 43, a transparent spacer layer 44, and an ITO anode layer 45, which are sequentially deposited on the metal anode layer 42 and patterned as stripes; an inter-insulating layer 49 deposited on the ITO anode layer 45 and the metal oxide layer 42 between the stripes of the ITO anode layer 45, the transparent spacer layer 44, and the thin metal layer 43 and patterned to expose a light-emitting region of the ITO anode layer 45; an organic layer 46 including an HIL contacting the exposed region of the ITO anode layer 45, a HTL, an EML, an ETL, and an EIL, which are sequentially stacked upon one another; and a cathode layer 47 deposited on the organic layer 46 as a metallic total reflection layer.

In FIGS. 3A and 3B, reference numeral 48 denotes a separator to insulate the cathode layer 47 to discriminate a light-emitting region and a non-light emitting region. In an organic EL device, according to another embodiment of the present invention where such a separator is not formed, the cathode layer 47 may be formed as a pattern remaining only in the light-emitting region and perpendicular to the ITO anode layer 45, so that the light-emitting region and the non-light emitting region may be separated from one another.

The organic EL device according to the second embodiment of the present invention is the same as the organic EL device according to the first embodiment described above with reference to FIGS. 2A and 2B, except for the structures of the thin metal layer 43 and the transparent spacer layer 44 formed as stripes aligned with the stripes of the anode layer 45. Thus, detailed descriptions on the functions of the layers constructing the organic EL device according to the second embodiment of the present invention are not repeated here.

In the organic EL device according to the second embodiment of the present invention, the optical distance between the thin metal layer 43 and the cathode layer 47, i.e., the optical thicknesses of the multiple layers forming the microcavity structure, is adjusted to be an integer multiple of half of each of the peak wavelengths of red, green, and blue light. In other words, the optical distance (thickness) between the thin metal layer 43 and the cathode layer 47 is determined to be the least common multiple of half the red, green, and blue peak wavelengths, and the thickness of the transparent spacer layer 44 is adjusted according to the determined optical thickness to manufacture an organic EL device providing photoluminescent spectra having desired peak wavelengths of red, green, and blue light. Equations (1) and (2) and Tables 1 and 2 applied in the first embodiment described above may be applied for the organic EL device according to the second embodiment of the present invention.

However, in manufacturing the organic EL device according to the second embodiment of present invention, it is difficult to etch the ITO anode layer 45, the transparent spacer layer 44, and the thin metal layer 43 simultaneously into a desired pattern. To compensate for this drawback in a manufacturing process, organic EL devices are described in the following third and fourth embodiments of the present invention.

Figure 4:
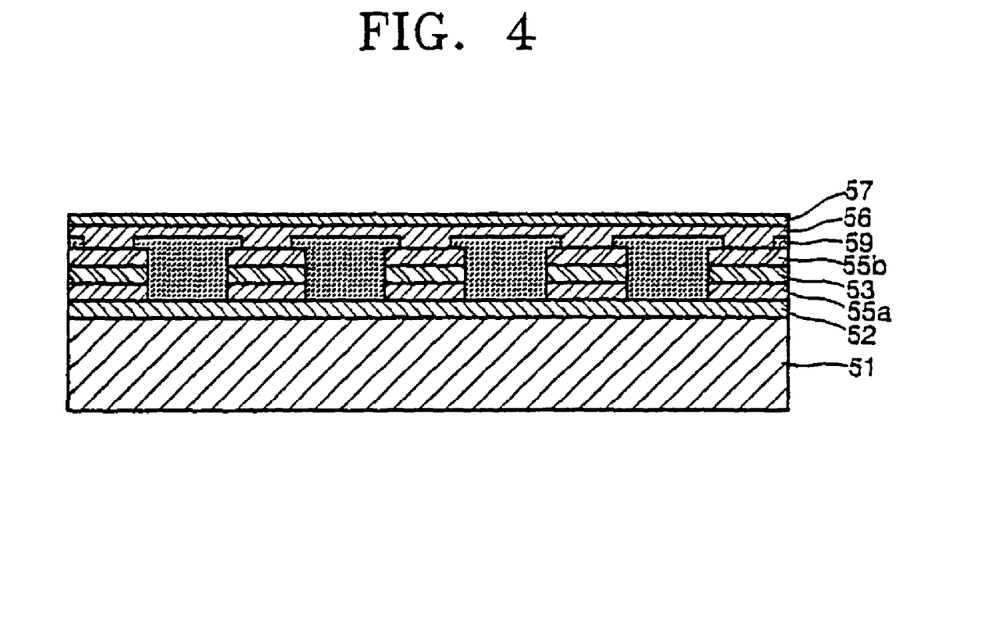
FIG. 4 is a sectional view of an organic EL device according to a third embodiment of the present invention.

FIG. 4 is a sectional view of an organic EL device according to a third embodiment of the present invention. Referring to FIG. 4, an organic ED device according to the third embodiment of the present invention includes a glass substrate 51; a metal oxide layer 52 deposited on the glass substrate 51; a first ITO anode layer 55a, a thin metal layer 53, and a second ITO anode layer 55b, which are sequentially stacked upon one another and patterned as stripes; an inter-insulating layer 59 deposited over the structure and patterned to expose a light-emitting region of the top surface of the second ITO layer 55b; an organic layer 56 deposited on the inter-insulating layer 59 and the exposed region of the second ITO anode layer 55b as a pattern perpendicular to the stripe pattern of the second ITO anode layer 55b; and a cathode layer 57 formed on the organic layer 56 as a metallic total reflection layer.

In the organic EL device according to the third embodiment of the present invention, the first ITO anode layer 55a instead of the transparent spacer layer 44(34) is formed underneath the thin metal layer 53, and the cathode layer 57, and the thickness of the first ITO anode layer 55a is controlled to manufacture a microcavity structure satisfying the requirements. When using an ITO anode, light transmittance slightly drops, compared with when using the transparent spacer layer 44(34), but may be considerably increased by appropriately controlling the thickness of the first ITO anode layer 55a.

Figure 5:
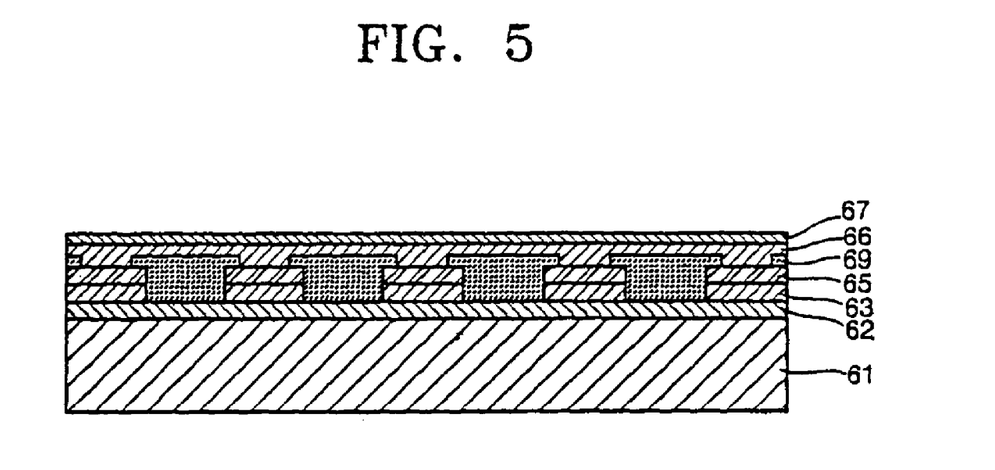
FIG. 5 is a sectional view of an organic EL device according to a fourth embodiment of the present invention

The rectifying characteristics of the organic EL device, according to the third embodiment of the present invention, may degrade with an etching profile. To overcome this drawback, the first anode layer 55a underneath the thin metal layer 63 is removed in an organic EL device according to a fourth embodiment of the present invention.

FIG. 5 is a sectional view of an organic EL device according to the fourth embodiment of the present invention. Referring to FIG. 5, an organic EL device according to the fourth embodiment of the present invention includes a glass substrate 61; a metal oxide layer 62 formed on the glass substrate 61; a thin metal layer 63 and an ITO anode layer 65, which are sequentially stacked upon one another and patterned as stripes; an inter-insulating layer 69 deposited over the structure and patterned to expose a light-emitting region of the surface of the ITO anode layer 65; an organic layer 66 formed on the inter-insulating layer 69 and the exposed region of the ITO anode layer 65 as a pattern perpendicular to the stripe pattern of the thin metal layer 63; and a cathode layer 67 formed on the organic layer 66.

In the organic EL device according to the fourth embodiment of the present invention, since the ITO anode layer 65 contacts the thin metal layer 63, resistance becomes low at a reduced thickness of the stacked structure, thus eliminating a problem arising from anodic resistance. Moreover, there is no need for an external auxiliary electrode, and thus, the manufacturing process is simplified at low costs.

While the present invention has been particularly described in the above with reference to embodiments thereof, the above embodiments of the present invention are for illustrative purposes and are not intended to limit the scope of the invention. For example, it will be understood by those skilled in the art that the refractive indices and the thicknesses of the layers, in addition to the transparent spacer layer, comprising a microcavity structure according to the present invention, may be controlled for effective constructive interference of red, green, and blue light and that the materials for the layers may be appropriately varied, without departing from the spirit and scope of the invention, as defined by the appended claims.

As described above, an organic EL device according to the present invention may induce optical resonance with a simple stacked structure including an additional semi-transparent, thin metal layer, to emit peak wavelengths of red, green, and blue light with great emission efficiency. Therefore, the organic EL device according to the present invention may display high-color purity, quality images.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic electroluminescent device comprising:
    a transparent substrate;
    a semi-transparent layer formed on the transparent substrate;
    a first anode layer formed on the semi-transparent layer as a predetermined pattern;
    a cathode layer formed of a metallic total reflection layer on the first anode layer; and
    an organic layer formed between the first anode layer and the cathode layer, which includes at least an emitting layer,
    wherein an optical distance between a top surface of the semi-transparent layer and a bottom of the cathode layer is determined to be a least integer multiple of half the peak wavelengths of light of a predetermined set of colors.

2. The organic electroluminescent device of claim 1, wherein the optical distance between the top surface of the semi-transparent layer and the bottom of the cathode layer is a sum of products of refractive indices and thicknesses of the respective first anode layer and the organic layer.

3. The organic electroluminescent device of claim 1, further comprising a transparent spacer layer between the semi-transparent layer and the first anode layer.

4. The organic electroluminescent device of claim 3, wherein the optical distance between the top surface of the semi-transparent layer and the bottom of the cathode layer is a sum of products of refractive indices and thicknesses of the respective transparent spacer layer, the first anode layer, and the organic layer.

5. The organic electroluminescent device of claim 1, further comprising a second anode layer between the transparent substrate and the semi-transparent layer.

6. The organic electroluminescent device of claim 5, wherein the optical distance between the top surface of the semi-transparent layer and the bottom of the cathode layer is a sum of products of refractive indices and thicknesses of the respective first anode layer and the organic layer.

7. The organic electroluminescent device of claim 1, further comprising a metal oxide layer deposited on the top surface of the transparent substrate.

8. The organic electroluminescent device of claim 3, further comprising a metal oxide layer deposited on the top surface of the transparent substrate.

9. The organic electroluminescent device of claim 5, further comprising a metal oxide layer deposited on the top surface of the transparent substrate.

10. The organic electroluminescent device of claim 7, wherein the metal oxide layer is one selected from the group consisting of a $SiO_2$ layer, a $TiO_2$ layer, a $Y_2O_3$ layer, and a $Nb_2O_5$ layer.

11. The organic electroluminescent device of claim 8, wherein the metal oxide layer is one selected from the group consisting of a $SiO_2$ layer, a $TiO_2$ layer, a $Y_2O_3$ layer, and a $Nb_2O_5$ layer.

12. The organic electroluminescent device of claim 9, wherein the metal oxide layer is one selected from the group consisting of a $SiO_2$ layer, a $TiO_2$ layer, a $Y_{2O3}$ layer, and a $Nb_2O_5$ layer.

13. The organic electroluminescent device of claim 1, wherein the transparent substrate is a glass substrate.

14. The organic electroluminescent device of claim 1, wherein the semi-transparent layer is a thin metal layer.

15. The organic electroluminescent device of claim 14, wherein the thin metal layer is formed of one of silver and aluminum.

16. The organic electroluminescent device of claim 14, wherein the thin metal layer is formed of one of a silver-copper-gold alloy and a silver-palladium-copper alloy.

17. The organic electroluminescent device of claim 1, wherein the first anode layer and the organic layer are formed as a stripe pattern, and the cathode layer is formed as a stripe pattern perpendicular to the stripe pattern of the first anode layer and the organic layer.

18. The organic electroluminescent device of claim 1, wherein the first anode layer is formed as a stripe pattern, and the organic layer and the cathode layer are formed as a stripe pattern perpendicular to the stripe pattern of the first anode layer.

19. The organic electroluminescent device of claim 1, wherein the semi-transparent layer, the first anode layer, and the organic layer are formed as a stripe pattern, and the cathode layer is formed as a stripe pattern perpendicular to the stripe pattern of the semi-transparent layer, the first anode layer, and the organic layer.

20. The organic electroluminescent device of claim 1, wherein the semi-transparent layer and the first anode layer are formed as a stripe pattern, and the organic layer and the cathode layer are formed as a stripe pattern perpendicular to the stripe pattern of the semi-transparent layer and the first anode layer.

21. The organic electroluminescent device of claim 3, wherein the semi-transparent layer, the transparent spacer layer, the first anode layer, and the organic layer are formed as a stripe pattern, and the cathode layer is formed as a stripe pattern perpendicular to the stripe pattern of the semi-transparent layer, the transparent spacer layer, the first anode layer, and the organic layer.

22. The organic electroluminescent device of claim 3, wherein the semi-transparent layer, the transparent spacer layer, and the first anode layer are formed as a stripe pattern, and the organic layer and the cathode layer are formed as a stripe pattern perpendicular to the stripe pattern of the semi-transparent layer, the transparent spacer layer, and the first anode layer.

23. The organic electroluminescent device of claim 5, wherein the second anode layer, the semi-transparent layer, the first anode layer, and the organic layer are formed as a stripe pattern, and the cathode layer is formed as a stripe pattern perpendicular to the stripe pattern of the second anode layer, the semi-transparent layer, the first anode layer, and the organic layer.

24. The organic electroluminescent device of claim 5, wherein the second anode layer, the semi-transparent layer, and the first anode layer are formed as a stripe pattern, and the organic layer and the cathode layer are formed as a stripe pattern perpendicular to the stripe pattern of the second anode layer, the semi-transparent layer, and the first anode layer.

* * * * *

UNITED STATES PATENT AND TRADEMARK OFFICE
CERTIFICATE OF CORRECTION

PATENT NO. : 7,098,590 B2  
APPLICATION NO. : 10/663762  
DATED : August 29, 2006  
INVENTOR(S) : Jung Ku Lim et al.

Page 1 of 1

It is certified that error appears in the above-identified patent and that said Letters Patent is hereby corrected as shown below:

Column 10, line 50, change "$Y_{2o3}$" to -- $Y_2O_3$ --

Signed and Sealed this

Sixth Day of February, 2007

JON W. DUDAS  
*Director of the United States Patent and Trademark Office*